United States Patent [19]

Paxton

[11] Patent Number: 5,721,493
[45] Date of Patent: Feb. 24, 1998

[54] APPARATUS FOR LOCATING FAILURES IN DETONATION DEVICES

[75] Inventor: Eric C. Paxton, Johannesburg, South Africa

[73] Assignee: Altech Industries (Proprietary) Limited, Boksburg East, South Africa

[21] Appl. No.: 607,369

[22] Filed: Feb. 27, 1996

[30] Foreign Application Priority Data

Feb. 28, 1995 [ZA] South Africa ............... 95/1644

[51] Int. Cl.⁶ .................................. G01R 31/00
[52] U.S. Cl. .................................. 324/502; 102/217
[58] Field of Search .................. 102/200, 275.8, 102/275 R, 301, 314, 318, 215, 217, 312; 324/500, 502

[56] References Cited

U.S. PATENT DOCUMENTS

| | | | |
|---|---|---|---|
| 2,976,485 | 3/1961 | Bartz | 324/51 |
| 5,014,622 | 5/1991 | Jullian | 102/312 |
| 5,406,890 | 4/1995 | Marsh et al. | 102/217 |
| 5,520,114 | 5/1996 | Guimard et al. | 102/215 |

FOREIGN PATENT DOCUMENTS

92/1643 11/1992 South Africa.
93/9160 10/1994 South Africa.

*Primary Examiner*—Ernest F. Karlsen
*Assistant Examiner*—Thomas Valone
*Attorney, Agent, or Firm*—Jacobson, Price, Holman & Stern, PLLC

[57] ABSTRACT

A method is provided for locating failures in a sequentially arranged chain of detonation devices. The method comprises initiating a test signal and passing this signal sequentially along the chain from each correctly operating detonation device to the next after a predetermined delay at each device; monitoring the chain of detonation devices by receiving a confirmation signal from each correctly operating device which has received the test signal; and ascertaining the last device to have received the test signal by a cumulative count of the number of detonation devices which have received the test signal.

1 Claim, 4 Drawing Sheets

APPARATUS FOR LOCATING FAILURES IN DETONATION DEVICES

FIELD OF THE INVENTION

This invention relates to a method and apparatus for testing the integrity of a sequential arrangement of detonation devices activatable by an electronic blasting system.

BACKGROUND TO THE INVENTION

In South African Patent 89/0606 it is proposed that electronic detonation devices at a number of explosion sites are connected in series. An initiation signal is transmitted from device to device in the chain until the end of the chain is reached. A signal from the last detonation device in the chain is returned to a controller so that the correct functioning of the whole series can be verified.

The operation o this blasting system can be tested and verified before detonating the explosions, so that any defects in the blasting chain can be detected and corrected. The testing is performed by verifying the propagation of a test signal along the chain of detonation devices and back to the controller without initiating the explosions themselves.

A difficulty arises where there is a faulty device and the signal from the last detonation device does not return to the controller. Locating the failure then requires sequentially searching along the wiring of the detonation devices.

It is known to sample the timing cycle of each detonator in a chain, and to set the delay of each detonator by using the requisite number of cycles for a required time. This setting is activated by a calibration signal. If there is a fault preventing the loop track return of the calibration signal, the signal is sent in the opposite direction in the chain.

OBJECT OF THE INVENTION

It is an object af this invention to provide a method of and apparatus for locating failures in an interconnected chain of detonation devices for detonating sequentially timed explosions.

SUMMARY OF THE INVENTION

In accordance with this invention there is provided a method af locating failures in a sequentially arranged chain of detonation devices, comprising:

initiating a test signal and passing this signal sequentially along the chain from each correctly operating detonation device o the next after a predetermined delay at each device;

monitoring the chain of detonation devices by receiving a confirmation signal from each correctly operating device which has received the test signal and ascertaining the lass device to have received the test signal by a cumulative count of the number of detonation devices which have received the test signal.

The method preferred includes using the cumulative count to derive the status of the sequential blasting system, being a ready status signal if a confirmation signal has been received from every detonation device in the chain and a fault status signal if it has not.

The method may further include using the status signal to indicate the status at a control position removed from the explosion sites, the location of a fault in the chain being indicated additionally to a faulty status.

Preferably the status of the sequential blasting system is transmitted from the control position to a surface control centre.

Further, preferably, there is a selected timing delay of the propagation of the test signal at each detonating device equivalent to the timing interval required between successive explosions.

The selected timing delay will be zero where simultaneous explosions are required.

The method may extend to monitoring of the elapsed time between initiation of the test signal, and reception of the confirmation signal from the last detonating device in the chain, an verifying that the elapsed time is identical to the summation of the timing delays of all the detonation devices in the chain.

An important feature of the method provides for the confirmation signal to use a separate wire from that used to propagate the test signal. Preferably the separate wire is a wire used to carry a blast enabling voltage to detonator devices.

Where two or more detonation devices are timed to activate simultaneously, their confirmation signals will be sufficiently separated in time so that all devices may be correctly accounted for.

The invention extends to apparatus for locating failures in a chain of detonation devices connected for the detonation of sequentially timed explosions, comprising:

means for initiating a test and for passing this signal sequentially along a chain of detonation devices connected for the detonation of sequentially timed explosions, from each correctly operating detonation device to the next after a predetermined delay at each device;

means for monitoring the chain of detonation devices and for receiving a confirmation signal from each device which has received the test signal and a means for deriving a cumulative count of the number of detonation devices which have received the test signal, and for ascertaining, by means of such monitoring, the last device to have responded to the test signal.

The apparatus may include a display locatable at a control position removed from the explosion site, suitable for displaying the status of the sequential blasting system and, additionally, the location of a fault in the chain if the status of the sequential blasting system is faulty.

There is also provided for the apparatus to include a for means for transmitting the status of the sequential blasting system from the control position to a surface control centre.

BRIEF DESCRIPTION OF THE DRAWING

A preferred embodiment of the invention will be described below, by way of example only, with reference to the drawings in which.

DETAILED DESCRIPTION OF THE DRAWINGS WITH REFERENCE TO THE DRAWING

Figure 1:
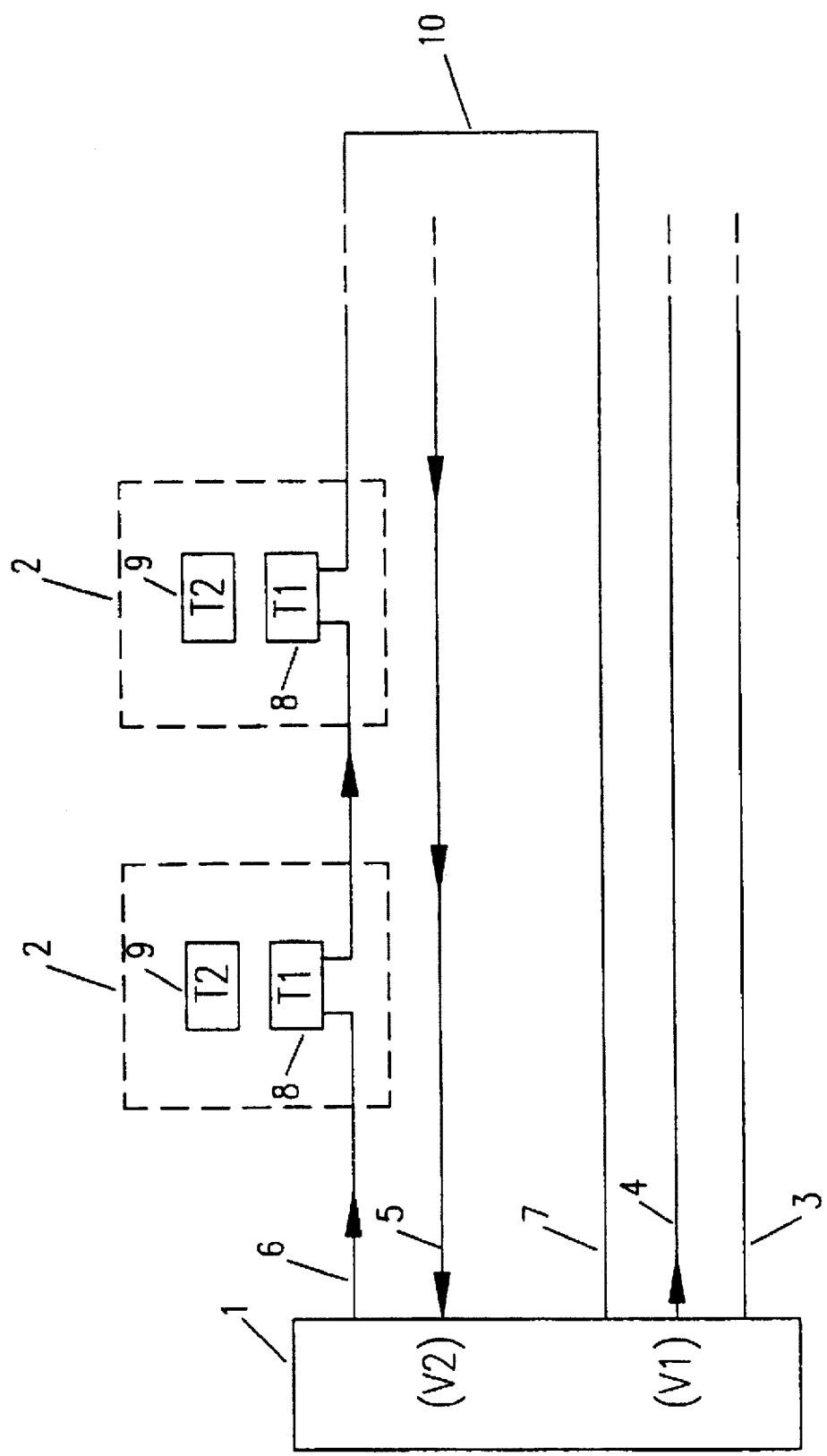
FIG. 1 is a diagrammatic view of blasting apparatus set up for sequential detonation according to the inventions

FIG. 1 is a diagrammatic view of apparatus for a sequential blasting system showing a control means (1) and a number of electronic detonator devices (2) which are connected sequentially in a chain by line (6) of a harness.

Each detonator device contains a timing element (8), having a timing delay of $T_1$ and a timing element (9), having a timing delay of $T_2$. The timing in the devices is inherently accurate and is set by crystal controlled oscillators. Detonator devices having preset delays are selected for desired delay sequence when blasting. Time delay $T_1$ is a selectable "timing interval" delay, that is the delay between detonation of adjacent detonator devices, and the $T_2$ timing delay is a fixed timing delay, common to all devices.

Since timing delay $T_2$ is the same for all devices, the sequence of detonations is set by arrangement of values of the individual timing delay's $T_1$. The timing delay $T_1$ may be selected to zero in which case the adjacent two or more devices having timing delay $T_1$ equal to zero, will fire simultaneously.

During the testing phase of the set up an initiation or test signal is sent from the control means (1) to the first detonation device along the harness line (6). After the delay time $T_1$ in the first detonator device, this initiation signal is regenerated in the first device, and passed on to the next device in the sequence.

In a similar manner the initiation signal is passed on to the next device and me on until the last device in the chain is initiated. For purposes of description the terminal at which line (6) enters a device is called "SIGIN" and where it leaves is called "SIGOUT". A link (10) is connected at the end of the harness line, so that the signal passed on from the last device now travels back to the control position along return line (7).

In this manner in a correctly linked system, with all units operating as required, the cumulative time of all the device delays, namely the sum of all the timing delay's $T_1$ is checked in the control means and compared with the planned firing delay. The control means will not show a ready status unless all the detonators are accounted for.

Any error in the sum of the delays counted is also indicated, since this would indicate the usage of detonators with the wrong delay setting.

The status of the blast can be transmitted from the control means (1) to a monitor or central control unit at the surface of an underground mine.

Each detonator device sends an acknowledge signal back to the control unit to indicate that it has received the initiation signal. This is of particular use if there is a discrepancy either in the total delay time recorded, or if there is some disconnection or malfunction which results in the pass-on signal not being returned to the control unit. If a fault exists, a cumulative count of the acknowledge signals received shows which detonator was the last to function correctly, and the next detonator or its connection is identified as being faulty.

There are three other lines 3, 4 and 5 in the harness which are used for signalling. Line 3 is a reference, or ground, line which serves as a return for currents sent along lines 4 and 5.

Line 4 is the control voltage supply of a low voltage $V_1$ to provide power for all of the control and timing circuits within each detonator device.

Line 5 is the activation voltage supply of higher voltage $V_2$ which provides power for charging energy storage capacitors in each detonator device, to initiate the blast. This higher voltage is applied to line 5 only at the time of tale decision to blast, and after all tests and safety procedures have been completed.

The line 5, however, since it is not required until the actual time of blasting, is used for the confirmation signal from each detonator. This means that it is not essential to know how many detonators there are in a chain being tested. If a return signal on line (7) is not received, then there is a fault at the harness or detonator following that detonator from which the last confirmation signal was received.

A variety of signalling messages are sent on the lines, dependent on the nature of the function. A "POWER ON" message is applied o line 4 in order to provide a "power on and reset" signal to enable the detonator devices. This signal is a low voltage $V_1$ (typically 7V) on line (4), which is applied to power up the control and timing circuits of the detonator devices.

A "GO" message is used to initiate the timers $T_1$ and $T_2$ in the detonator devices, in the sequence of the devices in the detonation chain. The message is passed from the control means (1) to the first detonator device at the SIGIN input, and after a delay time $T_1$ from the first detonator device, a signal is output on the SIGOUT line of device (1). This signal passed to the SIGIN of device number (2), and the signal is passed from one device to the next on line (6).

A "LOOP-BACK" message indicates the end of a sequence of GO messages, to the control unit. The message comprises the last "GO" signal at the SIGOUT line of the last detonator device. This line is connected to the return line (7) through the link (10), to the control means (1). Receipt of this signal by the control means confirms that all devices have been initiated and that all have now entered heir $T_2$ timing phase.

A "$T_2$ ACK" message is used to indicate the start of the delay time period caused by the timing device $T_2$. Each detonator device applies a 2 ms voltage pulse on line (5), which serves as an acknowledge pulse. The voltage pulse is not sent until after an "ACK SENT" message as set out below, is received from a previous detonator device.

At the end of each delay time period $T_2$, a "FIRE-ACK" message is applied along line (5), in the form of a 2 ms voltage pulse, sent immediately after the firing state is entered.

The ACK-SENT" message postpones the sending of the "$T_2$-ACK" message of devices later in the sequence, to prevent simultaneous transmission of a $T_2$ ACK message. To do this, each device returns its SIGOUT signal on line (6) to the ground state only after the $T_1$ ACK signal has been sent along lines (5). This feature is of particular importance for use in the case of adjacent detonator devices which have zero interval delays and are intended to be blasted simultaneously.

An "ABORT" message is used to abort the timing sequence, and comprise the removal of the $V_1$ volt age supply from line (4) for more than 0.5s. This removal implies the reduction of the voltage $V_1$ to below 3.5V, and will cause the timing sequence to be aborted by the control means (1).

An "ENABLE BLAST" message is used to charge all the capacitors in the detonation devices which are used to supply discharge energy for The blast. This message comprises the application of full voltage, typically 30V, to line (5) which was previously used for returning The $T_2$ ACK and the FIRE ACK signals. The returning confirmation signals, $T_2$ ACK, thus serve an additional and important function, by checking the integrity of the higher volt age blast enable line.

A "DISCONNECT" message is used to disconnect the wiring harness and enter a "stand alone" mode prior to initiation of blasting with the ENABLE BLAST message. This message comprises the removal of all The $V_1$ voltage supplies from their control circuits in all the detonator devices, when the device capacitors are charged to more than 5V. All the circuits of the detonator devices are now free running within the $T_2$ time delay period.

These messages and their functions are now described with reference to the more detailed diagrams of the wiring.

Figure 2:
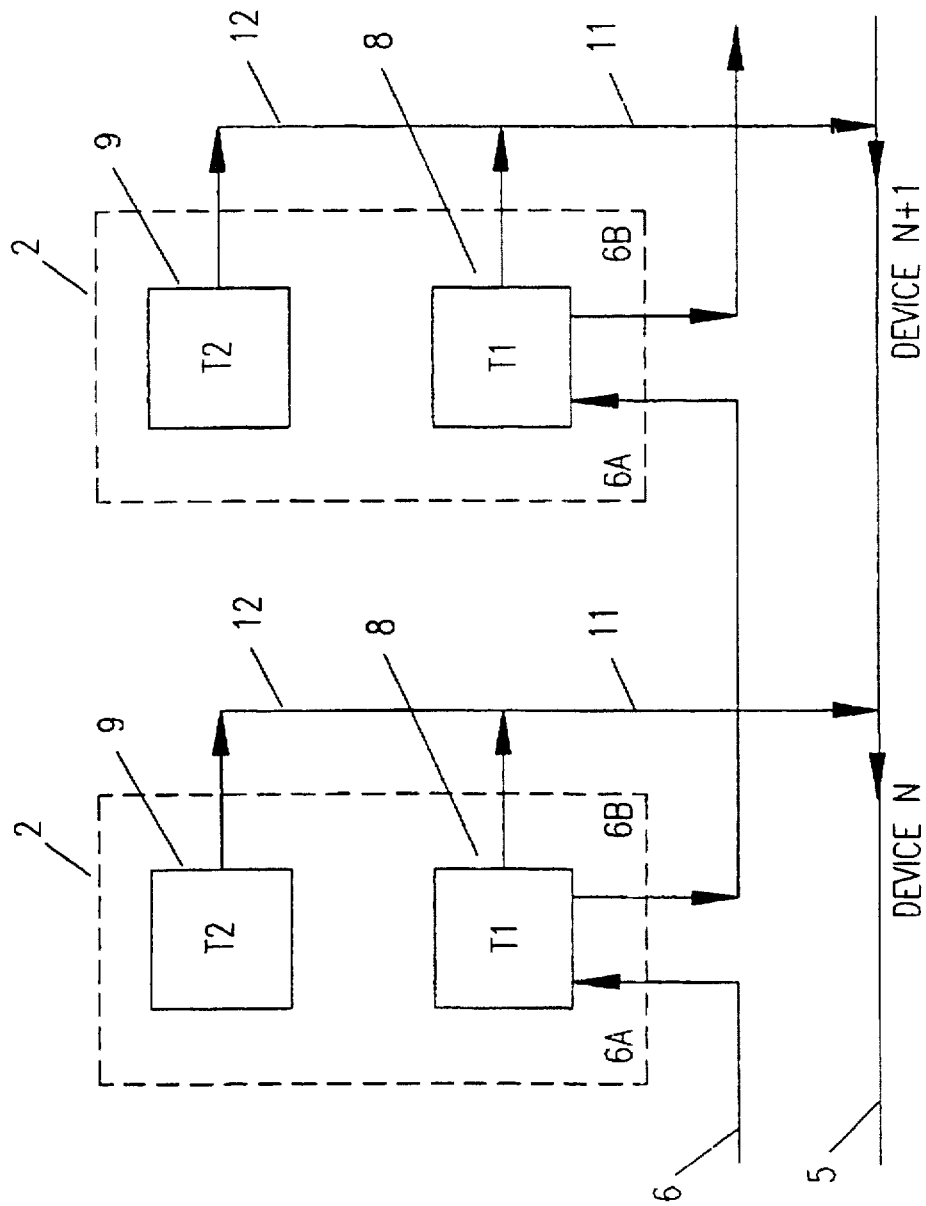
FIG. 2 is a diagram showing the interconnection between detonator devices of FIG. 1.

FIG. 2 As a diagram showing the interconnection between detonator devices, and the line reference numbering is the same as used in the description with reference to FIG. 1. Signals sent on lane (6) entering each device at its SIGIN terminal on line (6A) and leave at the SIGOUT terminal along line (6B). At the output of each of the $T_1$ timers (8), a connection (11) is made to line (5). This is the connection which conveys the acknowledge pulse, at some time after the delay $T_1$, back to the control on line (5). At the output of each of the $T_2$ timers (9), a connection is made by line (12) back to line (5).

Figure 3:
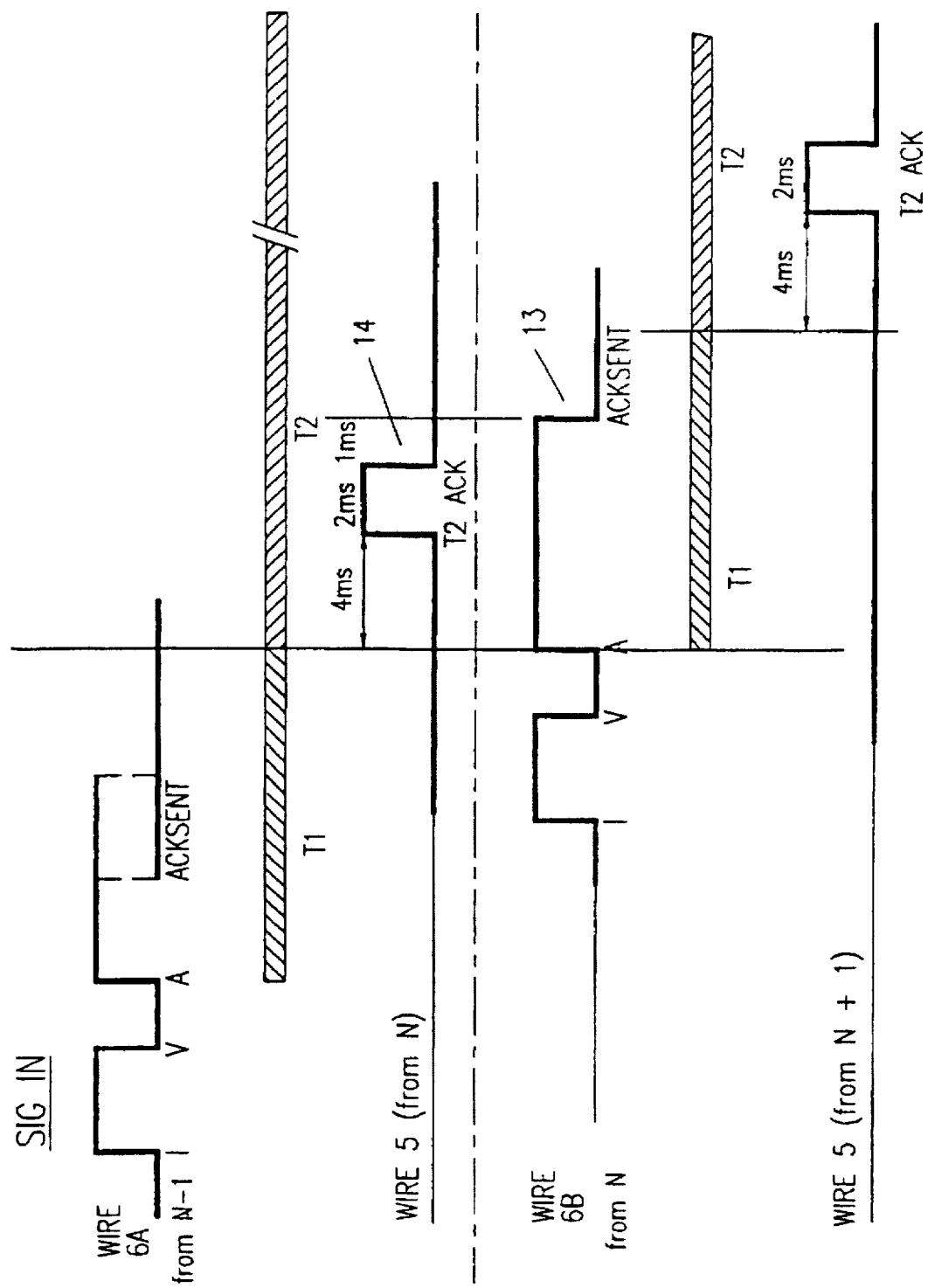
FIGS. 3 and 4 are timing diagrams for signals used in the embodiments of FIGS. 1 and 2.

FIG. 3 is a timing diagram showing the relationship between GO messages as they appear between adjacent devices and the timing of the acknowledge responses.

The GO message takes the form of a voltage increase from the ground state at "I"("initiate") followed on a fall at "V"("validate") with a further rise at A ("actuate"). The timing of "V" and "A" after "I" is critical and these transitions must occur within very narrow time slots to ensure that any spurious triggering is eliminated.

At the activate time "A" the first device activated and its time $T_1$, marked (8), starts. Just before the end of time $T_1$ an identical GO message is sent on its SIGOUT line (6B) to the next device, such that its activate time coincides exactly with the end of $T_1$ of the first device.

At the end of time $T_1$ of the first device therefore the following events occur:

(a) Timer $T_2$ in the first device is started.

(b) The acknowledge pulse $T_2$ ACK is readied for transmission via line (11) to line (5) back to control. This pulse is not yet sent, however, as is explained below.

(c) Time $T_1$ in the next device is started due to arrival of the activate part of the GO signal on it SIGIN terminal via line (6B).

The GO message is terminated by the ACK SENT event when the voltage on line (6) drops to the ground state. The timing of ACK SENT can occur only at multiples of 4ms and will be delayed by a suitable multiple of this interval until after the $T_2$ ACK message has been sent.

Referring to FIG. 3 it will be seen that the ACK SENT signal from device N into device N+1 at (13) is delayed until after device N has sent its $T_2$ ACK message on line (5) at (14).

Figure 4:
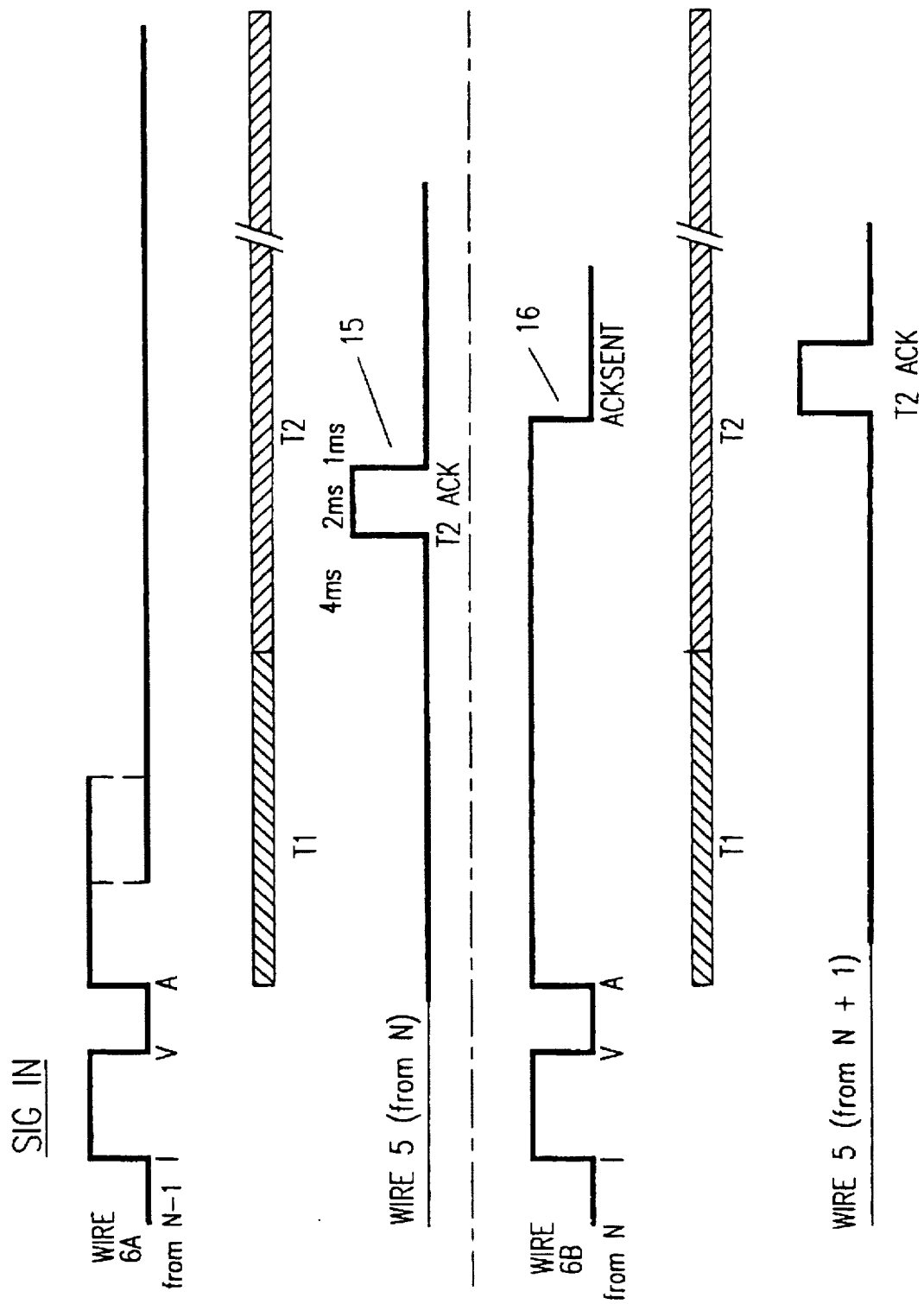

FIG. 4 shows how the timing of FIG. 3 changes for two adjacent devices timed to detonate simultaneously. The GO signal on SIGIN at device N starts its time $T_1$ and at the same time the GO signal is transmitted from its SIGOUT towards device N+1 starting its timer $T_1$ also.

Device N sends it $T_2$ ACK pules on line (5) at (15) and then returns its SIGOUT signal to the ground state at (16).

This then allows device N+1 to send its $T_2$ ACK pulse on line (5). In this way coincidence of the two $T_2$ ACK pulses are avoided.

The timing is arranged so that $T_2$ ACK can only be sent at least 4 ms after the $T_2$ state is entered. The $T_2$ ACK pulse lasts 2 ms and there is a further 1 ms wait before SIGOUT is dropped. The following $T_2$ ACK from device N+1 entering its $T_2$ state. There is therefore at least 1 ms between any two adjacent $T_2$ ACK pulses.

In the above description the timings are given to multiples of 1 ms for convenience but in the actual embodiment the intervals are derived from the crystal within each device and differ somewhat from these simplified values.

It should be apparent from the above description that an import ant feature of this embodiment is that the message passed on from any detonation device can differ from the message which is received by it and that this difference is designed to create a time window which will isolate acknowledge pulses from overlap even though there may be no interval delay between initiation of two or more adjacent devices.

The remaining return pulse, namely "FIRE ACK", is also transmitted back to control on line (5) and serves to indicate the number of inter-device delays greater than zero. Under blast conditions this pulse serves no purpose as it comes at the end of the device function when it is possible that the harness lines could be severed. Its chief purpose is to assure functionality at the production test stage.

What I claim as new and desire to secure by Letters Patent is:

1. Apparatus for locating failures in a chain of detonation devices each having timing delay and connected for the detonation of sequentially timed explosions, comprising:

means for sending an initiation signal to a first detonation device and for passing this signal sequentially along a chain of detonation devices connected sequentially in the chain by a closed loop harness for the detonation of sequentially times explosions, means regenerating the initiation signal in the first detonation device and passing the initiation signal from each correctly operating detonation device to the next after a predetermined delay at each device;

means for monitoring the chain of detonation devices and for receiving a confirmation signal from each device which has received the initiation signal; and a means for deriving a cumulative count of the number of detonation devices which have received the initiation signal, and for ascertaining, by means of such monitoring, the last device to have responded to the initiation signal, a display locatable at a control position removed from the explosion site, for displaying the status of the sequential blasting system, and additionally, the location of a fault in the chain if the status of the sequential blasting systems is faulty.

* * * * *